(12) United States Patent
Madraswala et al.

(10) Patent No.: US 11,693,582 B2
(45) Date of Patent: Jul. 4, 2023

(54) AUTOMATIC READ CALIBRATION OPERATIONS

(71) Applicant: Intel Corporation, Santa Clara, CA (US)

(72) Inventors: Aliasgar S. Madraswala, Folsom, CA (US); Ali Khakifirooz, Brookline, MA (US); Camila Jaramillo, San Jose, CA (US); John Egler, Folsom, CA (US); Netra Mahuli, Folsom, CA (US); Renjie Chen, San Jose, CA (US); Yogesh Wakchaure, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 135 days.

(21) Appl. No.: 16/947,592

(22) Filed: Aug. 7, 2020

(65) Prior Publication Data

US 2022/0043596 A1 Feb. 10, 2022

(51) Int. Cl.
*G06F 3/06* (2006.01)
*G11C 11/56* (2006.01)
*G11C 16/26* (2006.01)
*G11C 16/04* (2006.01)

(52) U.S. Cl.
CPC .......... *G06F 3/0655* (2013.01); *G06F 3/0604* (2013.01); *G06F 3/0679* (2013.01); *G11C 11/5642* (2013.01); *G11C 11/5671* (2013.01); *G11C 16/0483* (2013.01); *G11C 16/26* (2013.01)

(58) Field of Classification Search
CPC ...... G06F 3/061; G06F 3/0658; G06F 3/0659; G06F 3/067; G06F 3/0679; G06F 3/0683
See application file for complete search history.

(56) References Cited

U.S. PATENT DOCUMENTS

| | | | | |
|---|---|---|---|---|
| 6,031,773 | A | * | 2/2000 | Taylor ................... G11C 29/50 365/201 |
| 2019/0102097 | A1 | | 4/2019 | Madraswala et al. |
| 2019/0278653 | A1 | | 9/2019 | Padilla et al. |
| 2020/0142590 | A1 | | 5/2020 | Chew et al. |
| 2020/0159447 | A1 | | 5/2020 | Luo et al. |

* cited by examiner

*Primary Examiner* — Yong J Choe
(74) *Attorney, Agent, or Firm* — Alliance IP, LLC

(57) ABSTRACT

An apparatus comprises a plurality of memory cells; a plurality of sense circuits, a sense circuit comprising a sense node selectively coupled to a bitline coupled to a first cell of the plurality of memory cells; and a controller to transpose a value indicative of a voltage of the first cell to the sense node; isolate the sense node from the bitline; and calibrate a parameter for the sense circuit based on outputs of the sense circuit for each of a plurality of different applied values of the parameter.

20 Claims, 12 Drawing Sheets

FIG. 7

| Trim | Description |
|---|---|
| seg_arc_en | Enable or disable Segmented Auto Read Calibration<br>0 = Disable (default)<br>1 = Enable |
| seg_arc_lv[3:0] | Specify level for calibration<br>0 = N/A (default)<br>1 = L1 (TP, QLC WL, 16 states)<br>2 = L2 (XP, QLC WL, 16 states)<br>3 = L3 (TP, QLC WL, 16 states)<br>4 = L4 (UP, QLC WL, 16 states)<br>5 = L5 (TP, QLC WL, 16 states)<br>6 = L6 (XP, QLC WL, 16 states)<br>7 = L7 (TP, QLC WL, 16 states)<br>8 = L8 (LP, QLC WL, 16 states)<br>9 = L9 (TP, QLC WL, 16 states)<br>10 = L10 (XP, QLC WL, 16 states)<br>11 = L11 (TP, QLC WL, 16 states)<br>12 = L12 (UP, QLC WL, 16 states)<br>13 = L13 (TP, QLC WL, 16 states)<br>14 = L14 (XP, QLC WL, 16 states)<br>15 = L15 (TP, QLC WL, 16 states) |

700

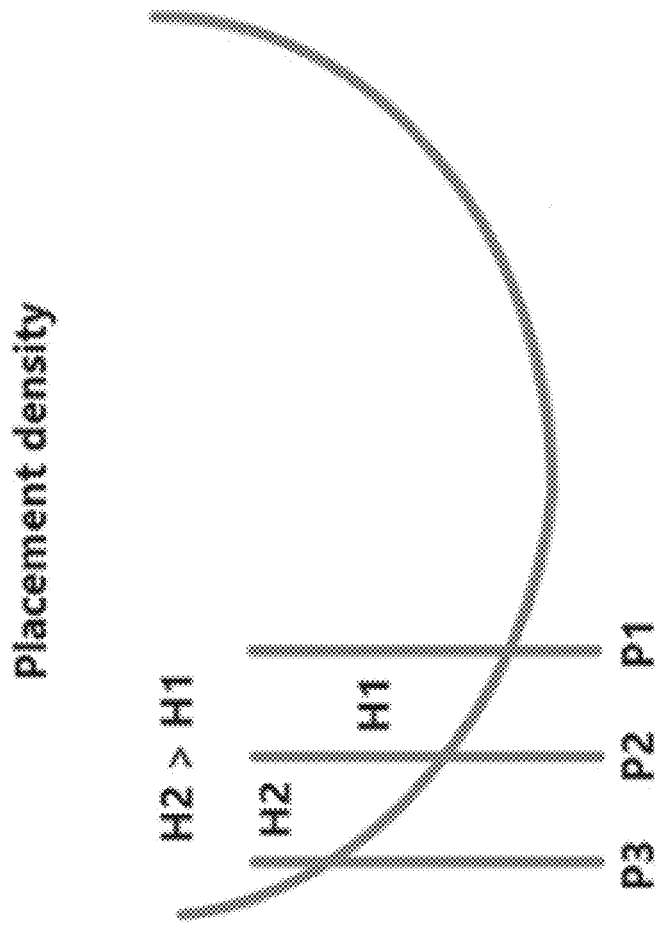

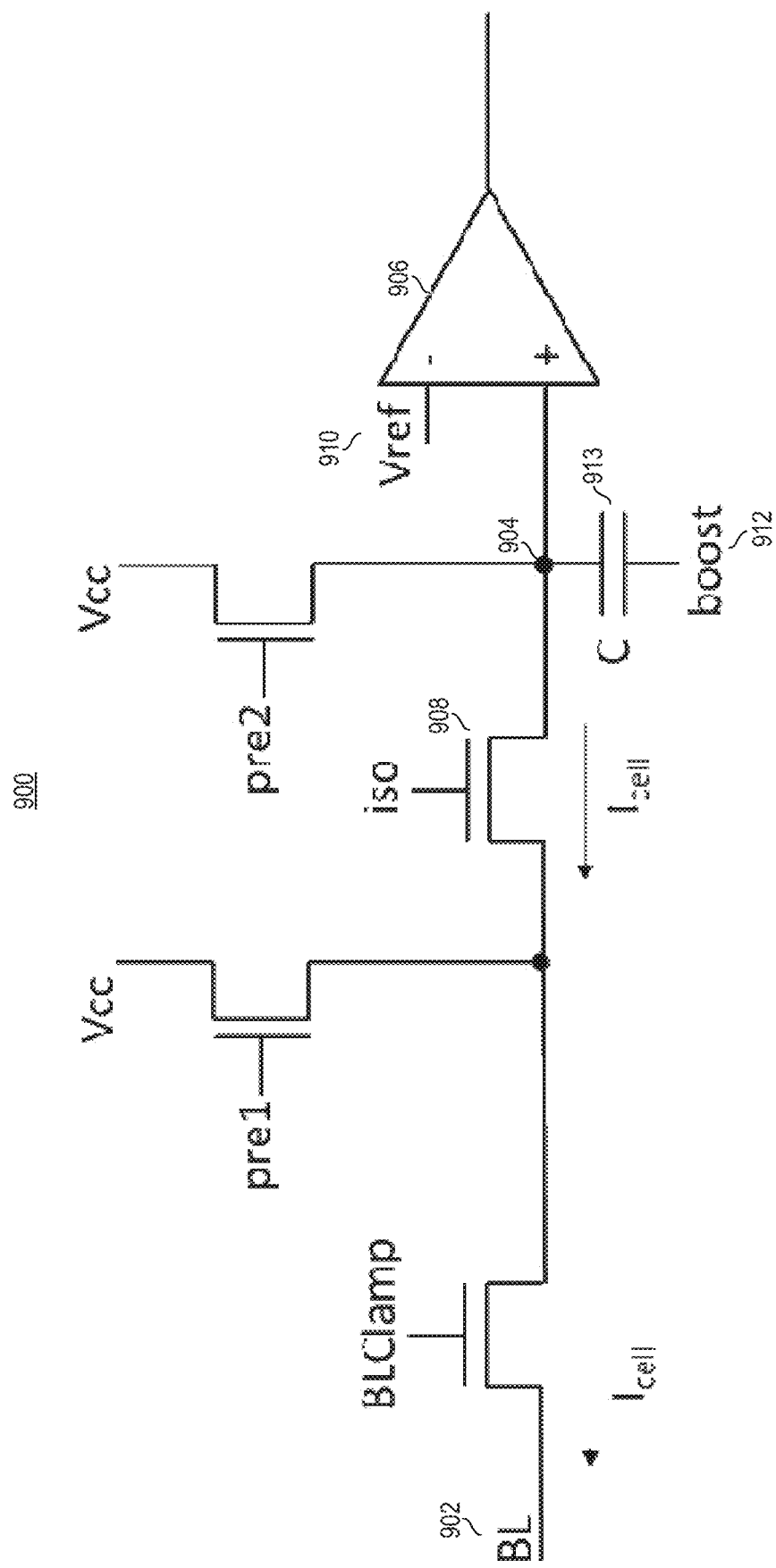

| Trim | Description |
|---|---|
| farc_en | Enable or disable Fast Auto Read Calibration<br>0 = Disable (default)<br>1 = Enable |
| farc_boost_v_high[7:0] | High boost voltage |
| farc_boost_v_med[7:0] | Medium boost voltage |
| farc_tempco_boost_v_high[7:0] | Temperature coefficient for high boost |
| farc_tempco_boost_v_med[7:0] | Temperature coefficient for medium boost |
| farc_boost_delta_t[7:0] | Boost ramp time |
| farc_histo_min[15:0] | Minimum histogram threshold |
| farc_histo_max[15:0] | Maximum histogram threshold |
| farc_gap[7:0] | Separation of the strobes in terms of word line voltage |
| farc_step[7:0] | Fine offset for calibration |
| farc_ofst[7:0] | Word line offset for centering the middle strobe |

FIG. 12

AUTOMATIC READ CALIBRATION OPERATIONS

BACKGROUND

A computer system may include one or more central processing units (CPUs) which may communicate with one or more storage devices. A CPU may include a processor to execute an operating system and/or other software applications that utilize a storage device coupled to the CPU. The software applications may write data to and read data from the storage device.

BRIEF DESCRIPTION OF THE DRAWINGS

FIG. 7 illustrates a table of configuration parameters associated with segmented automatic read calibration in accordance with certain embodiments.

FIG. 8 illustrates a placement density graph and effective read voltages in accordance with certain embodiments.

FIG. 9 illustrates a sense circuit for performing fast automatic read calibration in accordance with certain embodiments.

FIG. 12 illustrates a table of configuration parameters associated with fast automatic read calibration in accordance with certain embodiments.

Like reference numbers and designations in the various drawings indicate like elements.

DETAILED DESCRIPTION

Although the drawings depict particular computer systems, the concepts of various embodiments are applicable to any suitable integrated circuits and other logic devices. Examples of devices in which teachings of the present disclosure may be used include desktop computer systems, server computer systems, storage systems, handheld devices, tablets, other thin notebooks, systems on a chip (SOC) devices, and embedded applications. Some examples of handheld devices include cellular phones, digital cameras, media players, personal digital assistants (PDAs), and handheld PCs. Embedded applications may include, e.g., a microcontroller, a digital signal processor (DSP), an SOC, a network computer (NetPC), a set-top box, a network hub, a wide area network (WAN) switch, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising a group of computing devices.

Figure 1:
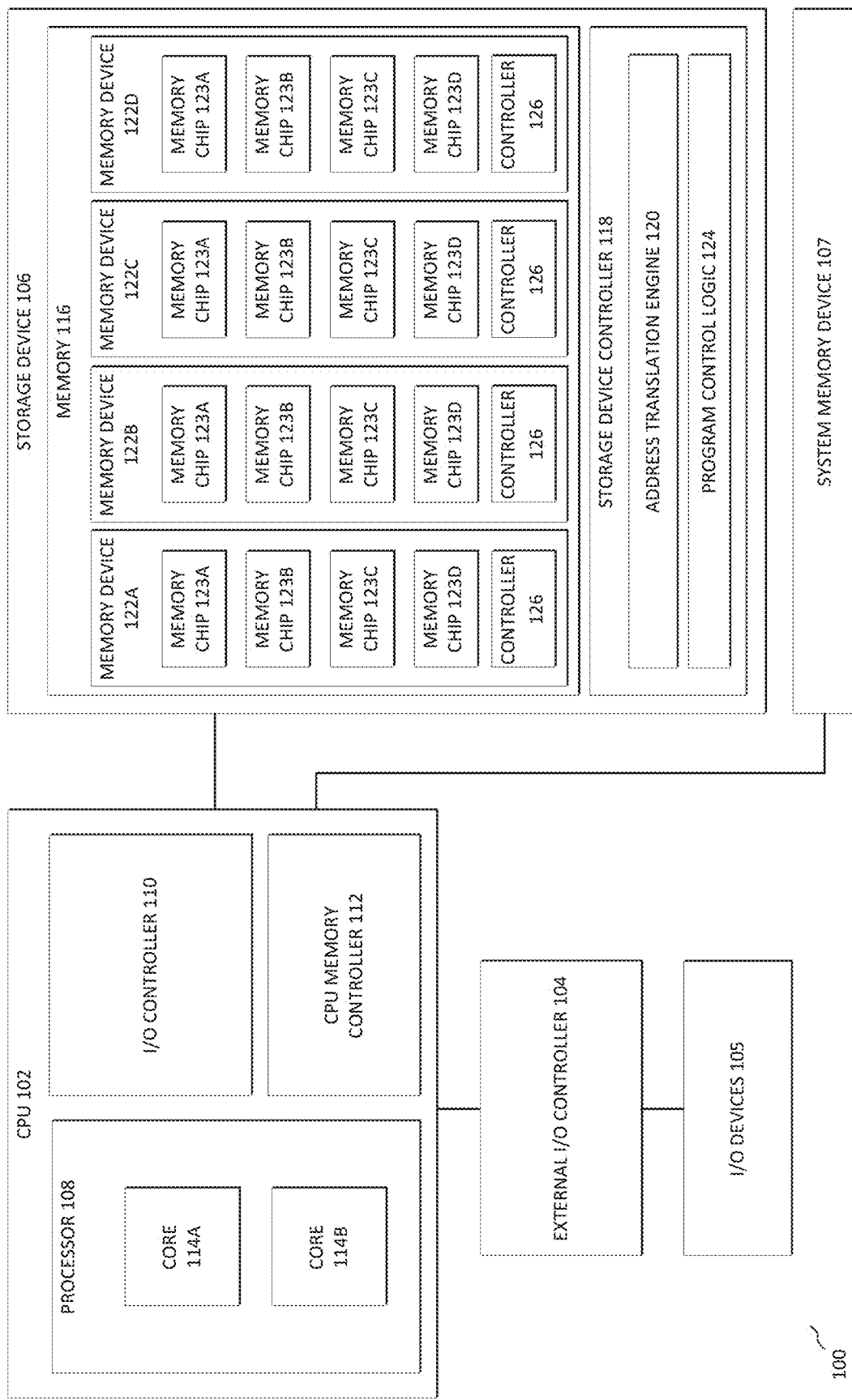
FIG. 1 illustrates a block diagram of a computer system to implement automatic read calibration operations in accordance with certain embodiments.

FIG. 1 illustrates a block diagram of a computer system 100 to implement automatic read calibration operations in accordance with certain embodiments. Automatic read calibration may be a method used by a memory device to calculate the optimal location of the read voltage levels based on the current life condition of a block of memory. Automatic read calibration may analyze the current distribution placement of a page, generate histograms, and interpolate the read voltage level to achieve optimal bit error rate performance. The calibrated read voltage levels can be used for subsequent read operations to achieve improved bit error rate on word lines that share the same life cycle and conditions of the previously calibrated word line.

Although conventional automatic read calibration has significant bit error rate benefits, it also may have a large performance impact in terms of read time depending on how it is implemented. For example, a read operation in which conventional automatic read calibration is performed may take nearly ten times the amount of time used to perform a regular read operation. Due to a limitation in terms of static page buffer resources, conventional automatic read calibration may also not be compatible with program suspend operations (where a write operation to the memory device is suspended in favor of another operation such as a read operation and then resumed later), a feature widely used for improving quality of service. There are also corner cases where conventional automatic read calibration is not optimal, such as scenarios in which the read voltage level is already centered within a valley between two program levels or is too far from the valley.

Various embodiments of the present disclosure provide enhanced alternatives to conventional automatic read calibration. A first alternative is referred to herein as segmented automatic read calibration and a second alternative is referred to herein as fast automatic read calibration. Various embodiments of these two alternatives may substantially reduce the performance impact (e.g., from 10× to 1.4×-2×) at a bit error rate that matches the bit error rate that can be achieved using conventional automatic read calibration. Some embodiments may handle corner cases in an optimal way compared to conventional automatic read calibration. Various embodiments may also be compatible with program suspend operations which are widely used to improve the quality of service in memory devices. Segmented automatic read calibration and fast automatic read calibration may improve quality of service on a system by making it possible to perform read calibration earlier in the read recovery flow, for example, when the bit error rate is higher than the error correcting code limit. Various automatic read calibration features described herein may be integrated into a proactive moving read reference or sticky word line group algorithms, as well as a replacement to the current method for solving the 3D NAND first page read effect.

Returning again to FIG. 1, CPU 102 comprises a processor 108, such as a microprocessor, an embedded processor, a digital signal processor (DSP), a network processor, a handheld processor, an application processor, a co-processor, an SOC, or other device to execute code (i.e., software instructions). Processor 108, in the depicted embodiment, includes two processing elements (cores 114A and 114B), which may include asymmetric processing elements or symmetric processing elements. However, a processor may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices. In other embodiments, the I/O controller 110 may be on a different chip from the CPU 102. I/O devices may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input devices such as a monitor, printer, mouse, keyboard, or scanner; or other suitable device. In a particular embodiment, an I/O device may comprise a storage device 106 that may be coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and an associated I/O device may communicate data and commands in accordance with a logical device interface specification such as NVMe (e.g., as described by one or more of the specifications available at www.nvmexpress.org/specifications) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller 110 may be located off-chip (e.g., not on the same chip as CPU 102) or may be integrated on the same chip as the CPU 102.

CPU memory controller 112 is an integrated memory controller that controls the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store temporary data, persistent data (e.g., a user's files or instruction sequences) that remains stored even after power to the system memory device 107 is removed, or a combination thereof. A system memory device 107 may be dedicated to a particular CPU 102 or shared with other devices (e.g., one or more other processors or other devices) of computer system 100.

In various embodiments, a system memory device 107 may include a memory comprising any number of memory arrays, a memory device controller, and other supporting logic (not shown). A memory array may include non-volatile memory and/or volatile memory. Non-volatile memory is a storage medium that does not require power to maintain the state of data stored by the medium, thus non-volatile memory may have a determinate state even if power is interrupted to the device. Nonlimiting examples of nonvolatile memory may include any or a combination of: solid state memory (such as planar or 3D NAND flash memory or NOR flash memory), 3D crosspoint memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory may comprise a transistor-less stackable cross point architecture in which memory cells sit at the intersection of words lines and bit lines and are individually addressable and in which bit storage is based on a change in bulk resistance.

Volatile memory is a storage medium that requires power to maintain the state of data stored by the medium (thus volatile memory is memory whose state (and therefore the data stored on it) is indeterminate if power is interrupted to the device). Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5, originally published by JEDEC in January 2020, HBM2 (HBM version 2), originally published by JEDEC in January 2020, or others or combinations of memory technologies, and technologies based on derivatives or extensions of such specifications.

A storage device 106 may store any suitable data, such as data used by processor 108 to provide functionality of computer system 100. For example, data associated with programs that are executed or files accessed by cores 114A and 114B may be stored in storage device 106. Thus, in some embodiments, a storage device 106 may store data and/or sequences of instructions that are executed or otherwise used by the cores 114A and 114B. In various embodiments, a storage device 106 may store persistent data (e.g., a user's files or software application code) that remains stored even after power to the storage device 106. A storage device 106 may be dedicated to CPU 102 or shared with other devices (e.g., another CPU or other device) of computer system 100.

In the embodiment depicted, storage device 106 includes a storage device controller 118 and a memory 116 comprising four memory devices 122A-D operable to store data, however, a storage device may include any suitable number of memory devices. A storage device 106 may include any number of memories 116 and each memory 116 may include any number of memory devices 122 (e.g., 122A-D). In a particular embodiment, a memory device 122 may be or comprise a semiconductor package with one or more memory chips 123 (e.g., memory chips 123A-D). In the embodiment depicted, memory 116 includes memory devices 122A-D (while specific references herein may be made to memory device 122A, the other memory devices may have any suitable characteristics of memory device 122A) and memory device controller 126.

A memory device 122A includes a plurality of memory cells that are each operable to store one or more bits (e.g., each memory chip of the memory device may include a plurality of memory cells). The cells of a memory device 122A may be arranged in any suitable fashion, such as in rows (e.g., wordlines) and columns (e.g., bitlines), three dimensional structures, and/or other manner. In various embodiments, the cells may be logically grouped into banks, blocks, subblocks, planes, wordlines, pages, frames, bytes, or other suitable groups.

A memory device 122A may include any of the volatile or non-volatile memories listed above or other suitable memory. In particular embodiments, memory device 122A includes non-volatile memory, such as planar or 3D NAND flash memory. In particular embodiments, a memory device 122A with non-volatile memory may comply with one or more standards for non-volatile memory promulgated by JEDEC, such as JESD218, JESD219, JESD220-1, JESD220C, JESD223C, JESD223-1, or other suitable existing or future standard (the JEDEC standards cited herein are available at www.jedec.org).

In various embodiments, a storage device 106 comprises NAND flash memory (herein a storage device comprising NAND flash memory is referred to as a NAND flash storage device). In some embodiments, storage device 106 may be a solid-state drive; a memory card; a Universal Serial Bus (USB) flash drive; or memory integrated within a device such as a smartphone, camera, media player, or other computing device. In general, storage devices with NAND flash memory are classified by the number of bits stored by each cell of the memory. For example, a single-level cell (SLC) memory has cells that each store one bit of data, a multi-level cell (MLC) memory has cells that each store two bits of data, a tri-level cell (TLC) memory has cells that each store three bits of data, a quad-level cell (QLC) memory has cells that each store four bits of data, and a penta-level cell (PLC) memory has cells that each store five bits of data, though some memories may utilize multiple encoding schemes (e.g., MLC and TLC) on the same array or on different arrays of the same device.

In a particular embodiment, a memory device 122 is embodied within a semiconductor package. In various embodiments, a semiconductor package may comprise a casing comprising one or more semiconductor dies (also referred to as chips), such as memory chips 123A-D. A package may also comprise contact pins or leads used to connect to external circuits. However, a package is merely one example form a memory device 122 may take as a memory device may be any suitable arrangement of one or more memory arrays and associated logic in any suitable physical arrangement. For example, although a single physical package may include a single memory device 122, multiple memory devices 122 could be resident on a single package or a memory device 122 could be spread across multiple packages.

A memory 116 may be embodied in one or more different physical mediums, such as a circuit board, die, disk drive, other medium, or any combination thereof (or combination with one or more packages). In a particular embodiment, memory 116 comprises a circuit board coupled to a plurality of memory devices 122 that each comprise a semiconductor package.

System memory device 107 and storage device 106 may comprise any suitable types of memory and are not limited to a particular speed, technology, or form factor of memory in various embodiments. For example, a storage device 106 may be a disk drive (such as a solid-state drive), a flash drive, memory integrated with a computing device (e.g., memory integrated on a circuit board of the computing device), a memory module (e.g., a dual in-line memory module) that may be inserted in a memory socket, or other type of storage device. Similarly, system memory 107 may have any suitable form factor. Moreover, computer system 100 may include multiple different types of storage devices.

System memory device 107 or storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. In some embodiments, a system memory device 107 or storage device 106 may include a communication interface to communicate with CPU memory controller 112 or I/O controller 110 in accordance with any suitable logical device interface specification such as NVMe, AHCI, or other suitable specification. In particular embodiments, system memory device 107 or storage device 106 may comprise multiple communication interfaces that each communicate using a separate protocol with CPU memory controller 112 and/or I/O controller 110.

Storage device controller 118 may include logic to receive requests from CPU 102 (e.g., via an interface that communicates with CPU memory controller 112 or I/O controller 110), cause the requests to be carried out with respect to a memory 116 (or memory devices(s) and/or memory chip(s) thereof), and provide data associated with the requests to CPU 102 (e.g., via CPU memory controller 112 or I/O controller 110). Storage device controller 118 may also be operable to detect and/or correct errors encountered during memory operation. In an embodiment, controller 118 also tracks the number of times particular cells (or logical groupings of cells) have been written to in order to perform wear leveling and/or to detect when cells are nearing an estimated number of times they may be reliably written to. In performing wear leveling, the storage device controller 118 may evenly spread out write operations among blocks of the memory of a memory 116 such that particular blocks are not written to more than other blocks. In various embodiments, controller 118 may also monitor various characteristics of the storage device 106 such as the temperature or voltage and report associated statistics to the CPU 102. Storage device controller 118 can be implemented on the same circuit board or device as a memory 116 or on a different circuit board, or device. For example, in some environments, storage device controller 118 may be a centralized storage controller that manages memory operations for multiple different memories 116 (which may each be of the same type of memory or may be of different types) of computer system 100 (and thus may provide storage device controller functionality described herein to any of the memories to which it is coupled).

In various embodiments, the storage device 106 also includes an address translation engine 120. In the depicted embodiment, the address translation engine 120 is shown as part of the storage device controller 118, although in various embodiments, the address translation engine 120 may be separate from the storage device controller 118 and communicably coupled to the storage device controller 118. In various embodiments, the address translation engine 120 may be integrated on the same chip or package as the storage device controller 118 or on a different chip or package.

In various embodiments, address translation engine 120 may include logic to store and update a mapping between a logical address space (e.g., an address space visible to a host computing device coupled to the storage device 106) and the physical address space of the memory 116 of the storage device 106 (which may or may not be exposed to the host computing device). The logical address space may expose a plurality of logical groups of data which are physically stored on corresponding physical groups of memory addressable through the physical address space of the storage device 106. A physical address of the physical address space may comprise any suitable information identifying a physical memory location (e.g., a location within a memory array of a memory 116) of the storage device 106, such as an identifier of the memory 116 on which the physical memory location is located, an identifier of the memory device 122A on which the physical memory location is located, one or more pages of the physical memory location, one or more subblocks of the physical memory location, one or more wordlines of the physical memory location, one or more bitlines of the physical memory location, or other suitable identifiers or encodings thereof.

In various embodiments, the storage device 106 also includes program control logic 124 which alone or in combination with a controller 126 of a memory device 122 is operable to control the programming sequence performed when data is written to a memory 116, the read sequence performed when data is read from a memory 116, or an erase sequence when data is erased from a memory 116. In various embodiments, program control logic 124 may provide the various voltages (or information indicating which voltages should be provided) that are applied to one or more memory cells, wordlines, bitlines, and/or other portions of a memory array during the programming, reading, and/or erasing of data, perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 may be located on the same package or chip as a memory 116 and/or memory devices 122A-D.

In some embodiments, all, or some of the elements of system 100 are resident on (or coupled to) the same circuit board (e.g., a motherboard). In various embodiments, any suitable partitioning between the elements may exist. For example, the elements depicted in CPU 102 may be located on a single die (i.e., on-chip) or package or any of the elements of CPU 102 may be located off-chip or off-package. Similarly, the elements depicted in storage device 106 may be located on a single chip or on multiple chips. In various embodiments, a storage device 106 and a host computing device (e.g., CPU 102) may be located on the same circuit board or on the same device and in other embodiments the storage device 106 and the host computing device may be located on different circuit boards or devices.

The components of system 100 may be coupled together in any suitable manner. For example, a bus may couple any of the components together. A bus may include any suitable interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, or a Gunning transceiver logic (GTL) bus. In various embodiments, an integrated I/O subsystem includes point-to-point multiplexing logic between various components of system 100, such as cores 114, memory controller 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a host computing device (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 2:
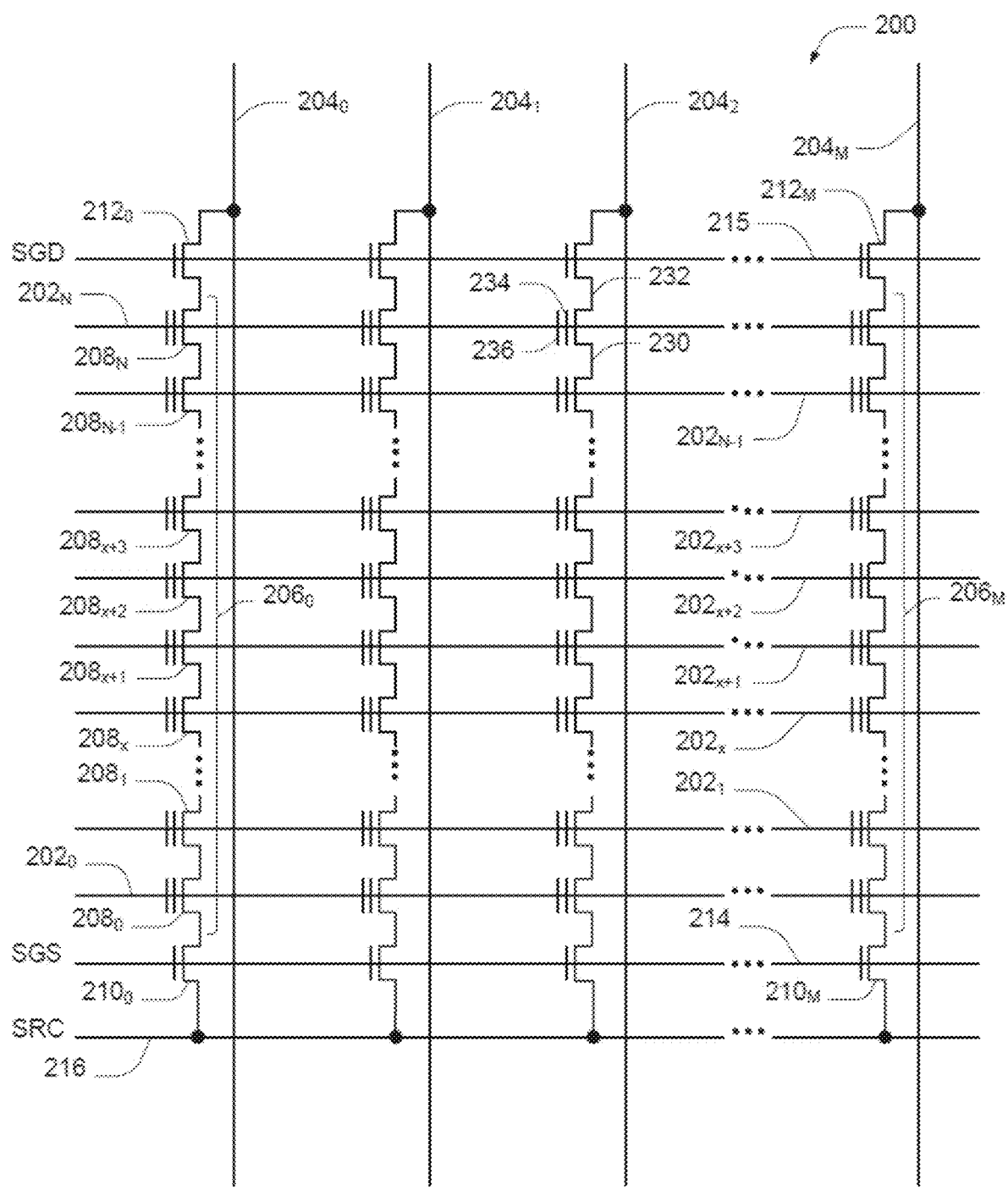
FIG. 2 illustrates an example portion of a NAND flash memory array in accordance with certain embodiments.

FIG. 2 illustrates an example portion of a NAND flash memory array 200 in accordance with certain embodiments. In various embodiments, memory device 122A includes an array 200 of memory cells logically arranged in rows and columns. Memory cells of a logical row are typically connected to the same access line (commonly referred to as a word line) while memory cells of a logical column are typically selectively connected to the same data line (commonly referred to as a bit line). In some embodiments, a single access line may be associated with more than one logical row of memory cells and a single data line may be associated with more than one logical column. Memory cells of the array are capable of being programmed to one of at least two data states (i.e., program levels).

Memory array 200 includes access lines, such as word lines $202_0$ to $202_N$, and data lines, such as bit lines $204_0$ to $204_M$. In some embodiments, the word lines 202 may be connected to global access lines (e.g., global word lines) in a many-to-one relationship.

Memory array 200 may be arranged in rows (each corresponding to a word line 202) and columns (each corresponding to a bit line 204). Each column may include a string of series-connected memory cells, such as one of NAND strings $206_0$ to $206_M$. Each NAND string 206 may be connected (e.g., selectively connected) to a common source 216 and may include a plurality of memory cells. For example, NAND string $206_0$ includes memory cells $208_0$ to $208_N$. The memory cells 208 represent non-volatile memory cells for storage of data. The memory cells 208 of each NAND string 206 may be connected in series between a select transistor 210 (e.g., a field-effect transistor), such as one of the select transistors $210_0$ to $210_M$ (e.g., that may each be a source select transistor, commonly referred to as select gate source), and a select transistor 212 (e.g., a field-effect transistor), such as one of the select transistors $212_0$ to $212_M$ (e.g., that may each be a drain select transistor, commonly referred to as select gate drain). Select transistors $210_0$ to $210_M$ may be commonly connected to a select line 214, such as a source select line, and select transistors $212_0$ to $212_M$ may be commonly connected to a select line 215, such as a drain select line. In a particular embodiment, a drain select line may be coupled to the drain select transistors of an entire subblock (and each subblock may have its own drain select line) while a source select line may be coupled to the source select transistors of an entire block (and each block may have its own source select line).

A source of each select transistor 210 may be connected to common source 216. The drain of each select transistor 210 may be connected to a memory cell $208_0$ of the corresponding NAND string 206. For example, the drain of select transistor $210_0$ may be connected to memory cell $208_0$ of the corresponding NAND string $206_0$. Therefore, each select transistor 210 may be configured to selectively couple a corresponding NAND string 206 to common source 216. A control gate of each select transistor 210 may be connected to select line 214.

The drain of each select transistor 212 may be connected to the bit line 204 for the corresponding NAND string 206. For example, the drain of select transistor $212_0$ may be connected to the bit line $204_0$ for the corresponding NAND string $206_0$. The source of each select transistor 212 may be connected to a memory cell of the corresponding NAND string 206. For example, the source of select transistor $212_0$ may be connected to memory cell $208_N$ of the corresponding NAND string $206_0$. Therefore, each select transistor 212 may be configured to selectively connect a corresponding NAND string 206 to a corresponding bit line 204. A control gate of each select transistor 212 may be connected to select line 215.

The memory array in FIG. 2 may be a quasi-two-dimensional memory array and may have a generally planar structure, e.g., where the common source 216, NAND strings 206 and bit lines 204 extend in substantially parallel planes. Alternatively, the memory array in FIG. 2 may be a three-dimensional memory array, e.g., where NAND strings 206 may extend substantially perpendicular to a plane containing the common source 216 and to a plane containing the bit lines 204 (that may be substantially parallel to the plane containing the common source 216).

Typical construction of memory cells 208 includes a data-storage structure 234 (e.g., a floating gate, charge trap, etc.) that maintains a data state of the cell (e.g., through changes in threshold voltage), and a control gate 236. In some cases, memory cells 208 may further have a defined source 230 and a defined drain 232. Memory cells 208 have their control gates 236 connected to (and in some cases form) a word line 202.

A column of the memory cells 208 is one or more NAND strings 206 selectively connected to a given bit line 204. A row of the memory cells 208 are memory cells commonly connected to a given word line 202. A row of memory cells 208 may (but need not) include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not expressly depicted in FIG. 2, it is apparent from the figure that the bit lines 204 of the array of memory cells 200 may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line may be deemed a physical page. For particular memory devices, all memory cells of a particular subblock commonly connected to a given word line may be deemed a physical page. For example, memory cells that are coupled to a particular wordline in a subblock may comprise a first physical page, memory cells that are coupled to the particular wordline in a second subblock may comprise a second physical page, and so on. A bit from each memory cell of a physical page may be deemed a logical page. Thus, a single physical page may store multiple logical pages (e.g., a TLC scheme may store three logical pages in a single physical page).

In sensing (e.g., reading) a data state of a selected (e.g., target) memory cell, the memory cell is selectively activated in response to a particular voltage level applied to its control gate while current paths from the memory cell to the data line and to the source are established, thus permitting current flow, or lack thereof, between the data line and the source to indicate whether the memory cell has been activated in response to the particular voltage level applied to its control gate. For example, for a sensing operation of selected memory cell $208_{x+1}$ of NAND string $206_0$, a sense voltage (e.g., a read voltage or a verify voltage) may be applied to the control gate of memory cell $208_{x+1}$ while voltage levels are applied to the control gates of memory cells $208_0$ to $208_x$ and $208_{x+2}$ to $208_N$ of NAND string $206_0$ sufficient to activate those memory cells regardless of their data states, and while voltage levels are applied to the control gates of select transistors $210_0$ and $212_0$ sufficient to activate those transistors. A sense operation that determines whether the memory cell $208_{x+1}$ is activated in response to one or sense voltages may indicate one or more bits of the data state stored in that memory cell. In various embodiments, each memory cell 208 can be programmed according to an SLC, MLC, TLC, QLC, PLC, or other encoding scheme. Each cell's threshold voltage (Vt) is indicative of the data that is stored in the cell.

Although various embodiments have been described with respect to a particular type of memory array (e.g., a NAND flash memory array), the teachings of the various embodiments may be equally applicable to any type of memory arrays (e.g., AND arrays, NOR arrays, etc.), including those recited herein or similar memory arrays.

Figure 3:
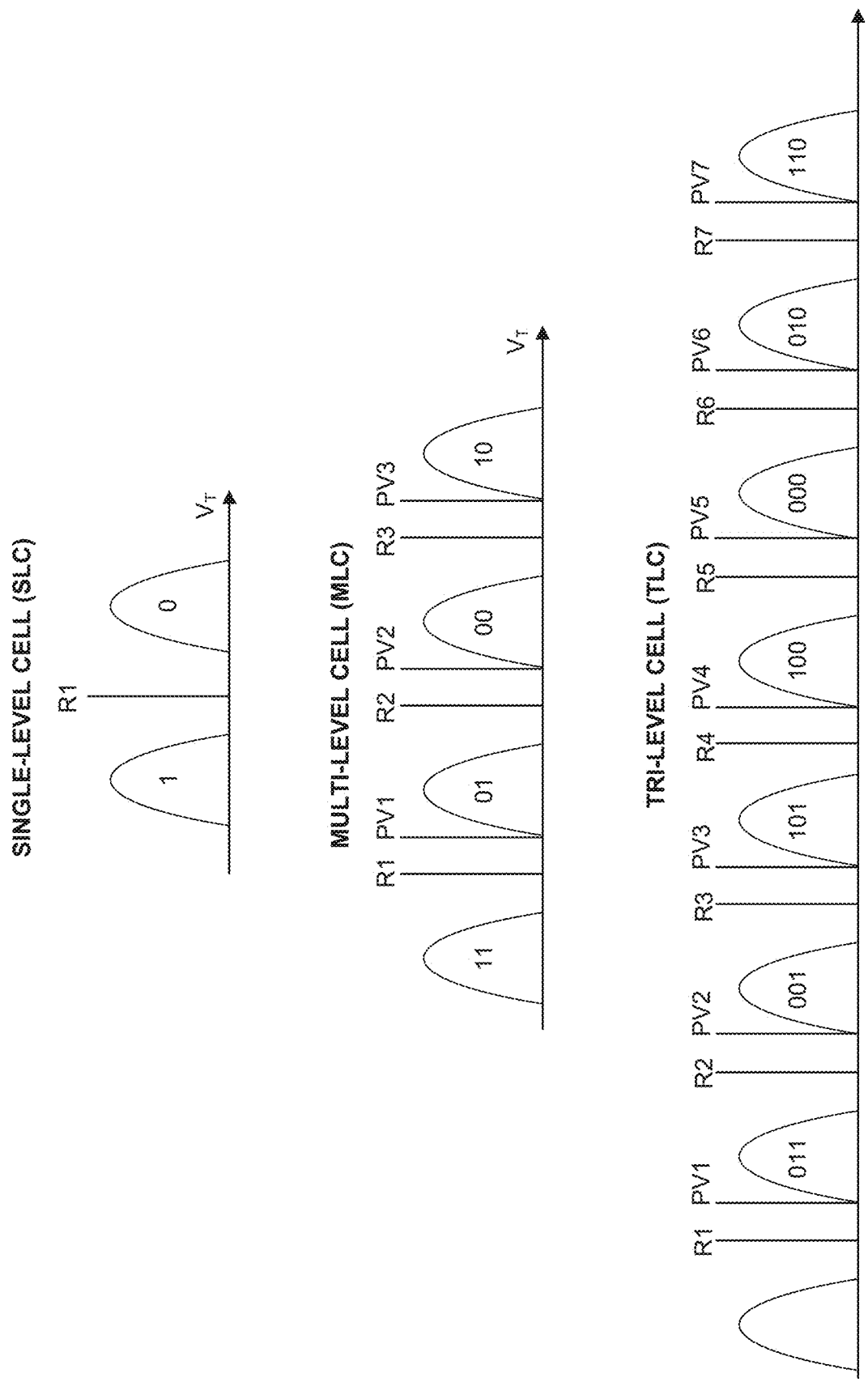
FIG. 3 illustrates example encodings of bits within NAND flash memory cells in accordance with certain embodiments.

FIG. 3 illustrates example encodings of bits within NAND flash memory cells 208 in accordance with certain embodiments. In the embodiment depicted, each elliptical region represents a range of threshold voltages that correspond to the value encoded within the cell. For example, in the SLC encoding scheme, lower threshold voltages correspond to the bit value 1 and higher threshold voltages correspond to the bit value 0. As another example, in the MLC encoding scheme, the lowest range of threshold voltages corresponds to "11", the next highest range of threshold voltages corresponds to "01", the next highest range of threshold voltages corresponds to "00", and the highest range of threshold voltages correspond to "10." Similarly, for the TLC encoding scheme (or other encoding schemes not shown), various ranges of threshold voltages correspond to various values of the bits encoded within each cell.

A program level may refer to one of the depicted elliptical regions. In other words, a program level may correspond to one of the bit encodings used in the encoding scheme. In general, if a cell is to store the value represented by the lowest voltage region, the cell does not need to be programmed (since in its erased state it already has a threshold voltage in the lowest voltage region). Accordingly, as used herein, the next lowest region (e.g., "01" of the MLC scheme or "011" of the TLC scheme) will be referred to as the first program level, the next region (e.g., "00" of the MLC scheme or "001" of the TLC scheme) will be referred to as the second program level, and so on. Under this terminology, the MLC scheme has three program levels, the TLC scheme has seven program levels, the QLC scheme has fifteen program levels, and the PLC scheme has thirty one program levels. When data (e.g., one or more pages) is written to memory 116, a plurality of the cells may be programmed to a first program level, a plurality of the cells may be programmed to a second program level, and so on.

The various R voltage values depicted in FIG. 3 (e.g., R1, R2, R3, . . . ) represent read voltages that may be applied to a wordline when the values of cells coupled to that wordline are being read. When a particular read voltage is applied, sense circuitry may determine whether the threshold value of a cell is greater than or less than the read voltage based on a voltage or current sensed by the sense circuitry via the bitline of the cell. Although not shown in FIG. 3, a QLC encoding scheme may utilize a similar scheme where fifteen read voltages may be used to resolve the values of four bits within each cell, where R1<R2<R3< . . . <R15 and a PLC encoding scheme may utilize a similar scheme where thirty one read voltages may be used to resolve the values of five bits within each cell, where R1<R2<R3< . . . <R31.

The various program verify voltages (PV1-PV3 in the MLC encoding scheme and PV1-PV7 in the TLC encoding scheme) depicted represent program verify voltages that may be applied to a cell during programming of the cell (e.g., during a program verify operation) to determine whether the threshold voltage of the cell has reached its desired level. For example, in the MLC encoding scheme, if the cell is to be programmed to "01" (i.e., program level 1), then PV1 may be applied to the cell during a verify procedure and if sensing circuitry determines that the threshold voltage of the cell is greater than PV1, then the cell is considered to have passed programming. If the threshold voltage of the cell is less than PV1, the cell is considered to not have passed programming and the storage device 106 may attempt to raise the threshold voltage of the cell or may allow the cell to fail and may later attempt error correction on the cell. As another example, if the cell is to be programmed to "00" (i.e., program level 2), then PV2 may be applied to the cell during a verify procedure and if sensing circuitry determines that the threshold voltage of the cell is greater than PV2, then the cell is considered to have passed programming. Similarly, if the cell is to be programmed to "10" (i.e., program level 3), then PV3 may be applied to the cell during a verify procedure. Any suitable program verify voltages may be used for any of the encoding schemes. In particular embodiments and as depicted, the program verify voltage may be set to a value that is at or near the beginning of the corresponding threshold voltage range. In various embodiments, there may be some margin between a program verify voltage and a corresponding read level voltage to allow for slight threshold voltage droopage over time and to improve sensing accuracy. For example, the figure depicts a margin between R1 and PV1, a margin between R2 and PV2, and so on.

In particular embodiments, cells may be programmed one or more pages (e.g., logical pages) at a time, where a page is stored in a group of cells (e.g., a physical page) that are coupled to the same wordline. For example, the group of cells that is programmed may be identified by a particular wordline and a particular subblock. The group of cells may store one page of data (if the cells are encoded according to an SLC scheme) or multiple pages of data (if the cells are encoded according to an MLC, TLC, QLC, PLC, or other multi-level encoding scheme).

In various embodiments, a cell that is encoded to store multiple bits may form a part of multiple different pages, with each bit of the cell corresponding to a distinct page. For example, for a cell that is encoded with two bits (i.e., using an MLC encoding scheme), one bit may correspond to an Upper Page (UP) and the other bit may correspond to a Lower Page (LP). As another example, for a cell that is encoded with three bits (i.e., using a TLC encoding scheme), one bit may correspond to an LP, one bit may correspond to a UP, and the other bit may correspond to an Extra Page (XP). As yet another example, for a cell that is encoded with four bits (i.e., using a QLC encoding scheme), one bit may correspond to an LP, another bit may correspond to a UP, another bit may correspond to an XP, and the final bit may correspond to a Top Page (TP). Each page (e.g., LP, UP, XP, or TP) may comprise an aggregation of corresponding bits stored by a plurality of different cells of a wordline (e.g., a physical page). For example, referring to the encoding shown in FIG. 3, all of the rightmost bits of a plurality of cells encoded using a TLC scheme may form an LP, all of the middle bits of the plurality of cells may form a UP, and all of the leftmost bits of the plurality of cells may form an XP.

A programming sequence for a group of cells may comprise programming all of the intended pages into the group of cells. A programming sequence may include one or more programming passes. A programming pass (which may comprise one or more programming loops) may encode one or more pages. A programming pass may comprise the application of one or more effective program voltages to cells to be programmed followed by the application of one or more verify voltages to these cells in order to determine which cells have finished programming (subsequent programming passes generally will not apply an effective program voltage and/or a verify voltage to the cells that have finished programming). In some embodiments, one or more loops of a programming pass may comprise the application of one or more effective program voltages without the application of one or more verify voltages. The application of an effective program voltage to a cell may include changing the voltage difference between a control gate and a channel of the cell in order to change the threshold voltage of the cell. Thus, the voltage of a wordline (coupled to the control gate of the target cell) and/or a channel of the cell may be set in order to effectuate application of an effective program voltage. As a "program voltage" is commonly used to refer to a voltage applied to a wordline, the term "effective program voltage" is used herein to refer to the voltage difference between a control gate and channel of a cell (which in instances where the channel is held at 0 V will be synonymous with program voltage). Reference herein to a start program voltage may refer to either a program voltage or an effective program voltage.

As mentioned above, a programming pass may program one or more pages. For example, when the cells of a wordline are encoded using an MLC scheme, both pages (the LP and the UP) may be programmed during a single programming pass by setting the voltage levels of the cells to the desired program level (e.g., within one of the four voltage ranges depicted for the MLC scheme in FIG. 3). Alternatively, an LP could be programmed in a first pass and a UP could be programmed in a second pass. For example, during the first pass, first bits of the cells (where the first bits of the cells collectively form the LP) may be programmed to a binary state based on the desired value of each bit. For example, referring to the MLC scheme depicted in FIG. 3, if the rightmost bits of the cells form the LP, and a particular rightmost bit is to be programmed to a '0' value, the Vt of the cell may be programmed to a value that is slightly greater than PV2 in the first programming pass (or at least a portion of the way to PV2 so as to be distinguished from cells that are left in a low voltage erased state). If a particular rightmost bit is to be stored as a '1' value, it may be left at a low voltage level. During the second pass, second bits of the same cells (where the second bits of the cells collectively form the UP) are programmed, resulting in the Vt of the cells being changed to their desired Vt (e.g., within one of the four voltage ranges depicted for the MLC scheme in FIG. 3), thus storing values for the UP and the LP. As other examples, when the cells of a wordline are encoded using a TLC scheme or a QLC scheme, all pages may be programmed during a single programming pass by setting the voltage levels of the cells to the desired program level, or one or more of the pages may be programmed during a first pass and the remaining pages programmed during a second pass (or the remaining pages may be programmed using multiple additional passes). For example, in a TLC scheme, a first pass may encode an LP and a second pass may encode the UP and the XP. As another example, in a QLC scheme, a first pass may encode an LP and a UP and a second pass may encode the XP and the TP or a first pass may encode the LP and a second pass may encode the UP, XP, and TP.

In particular embodiments, a logical page of data (which may correspond to a page of data referred to by a computing host such as CPU 102) may correspond to an LP, UP, XP, TP, or other page of memory stored in cells that are encoded with multiple bits. Accordingly, two logical pages of data may correspond to an LP and a UP stored in a group of cells encoded using an MLC scheme, three logical pages of data may correspond to an LP, UP, and XP stored in a group of cells encoded using a TLC scheme, four logical pages of data may correspond to an LP, UP, XP, and TP stored in a group of cells encoded using a QLC scheme, and so on. Thus, when a computing host writes to storage device 106, if multiple pages are to be programmed in a single pass, multiple logical pages from the computing host may be aggregated and programmed in the pass. For example, in memory encoded using a TLC scheme, when the LP and UP are programmed in a single pass, two logical pages of data may be aggregated (where one logical page is stored in the LP and one logical page is stored in the UP).

Figure 4:
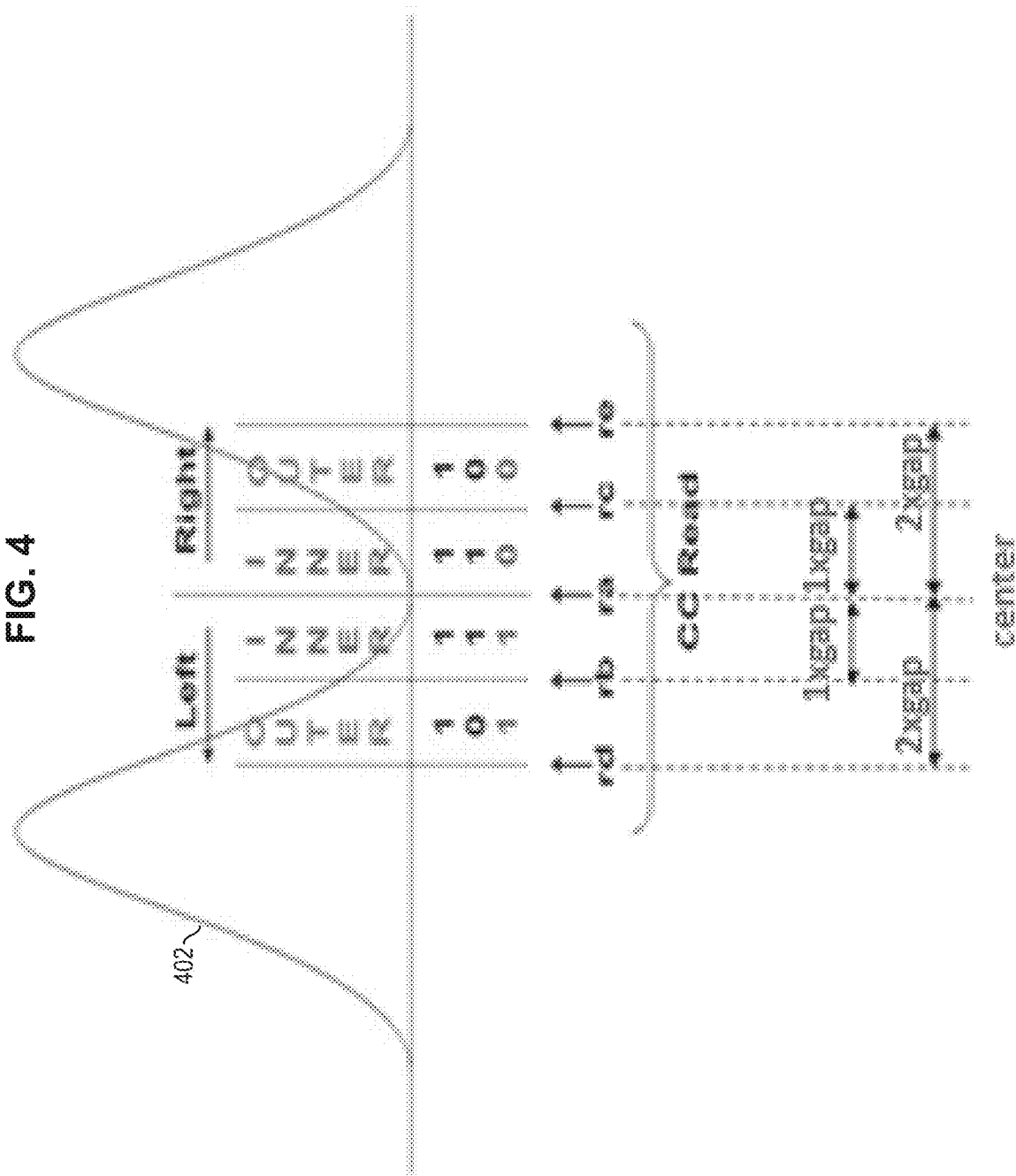
FIG. 4 illustrates a placement density graph and wordline read voltages of a segmented automatic read calibration operation in accordance with certain embodiments.

FIG. 4 illustrates a placement density graph 402 and wordline read voltages ra, rb, rc, rd, and re of a segmented automatic read calibration operation in accordance with certain embodiments. The x-axis of the placement density graph 402 represents threshold voltages of memory cells and the y-axis represents the number of cells having a respective threshold voltage (similar to the graphs depicted in FIG. 3). The wordline read voltages ra, rb, rc, rd, and re form a wordline read voltage set and represent wordline read voltages that may be applied during a segmented automatic read calibration operation. When each wordline read voltage is applied, a sense is performed for the page corresponding to the set of wordline read voltages. For example, the corresponding page may be the page that has cells that are expected to resolve to a first bit value (e.g., 0) when the threshold voltages of the cells are below the optimum wordline read voltage of the wordline read voltage set and to a second bit value (e.g., 1) when the threshold voltages of the cells are above the optimum wordline read voltage (though in real world conditions, one or more of the cells may exhibit different program behavior and thus may not resolve correctly even when the optimum wordline read voltage is applied). Thus, referring back to FIG. 3, if R4 is the wordline read voltage being applied, the corresponding page read may be the LP (the rightmost bit) as this bit transitions from 1 to the left of R4 to 0 to the right of R4 on the graph. Similarly, if R6 is the wordline read voltage being applied, the corresponding page read may be the UP (the middle bit) as this bit transitions from 0 to the left of R6 to 1 to the right of R6 on the graph.

In the embodiment depicted, the segmented automatic read calibration operation includes sensing at five evenly spaced wordline read voltages. In other embodiments, the wordline read voltages do not have to be evenly spaced and the set may include more or fewer wordline read voltages (e.g., 3 or 7). The wordline read voltages may be applied in any suitable order. In one example, the order may be ra, rb, rc, rd, re. In another example, the wordline read voltages may increase monotonically: rd, rb, ra, rc, re. After each wordline read voltage is applied, the same corresponding page is sensed.

As the various wordline read voltages are applied and the cells are sensed, a histogram is generated for each adjacent wordline read voltage pair. For example, in the embodiment depicted, a first histogram 101 is generated for rd and rb, a second histogram 111 is generated for rb and ra, a third histogram is generated for ra and rc, and a fourth histogram is generated for rc and re. Each histogram may include the number of bits of the page that flip between the different wordline read voltages applied. As an example, the sensed page value when rd is applied may be compared with the sensed page value when rb is applied and the number of bits that flipped may be counted and recorded in histogram 101, the sensed page value when rb is applied may be compared with the sensed page value when ra is applied and the number of bits that flipped may be counted and recorded in histogram 111, and so on. In various embodiments, the number of flipped bits may be counted using on-chip hardware (e.g., control circuitry on a memory chip 123), controller 126, storage device controller 118, or other suitable logic of system 100. After the histograms are generated, the interpolated minimum of placement density may be calculated for use in future read operations involving the cells that were sensed (or cells that are expected to behave similarly), e.g., using the flow described in FIG. 5.

Figure 5:
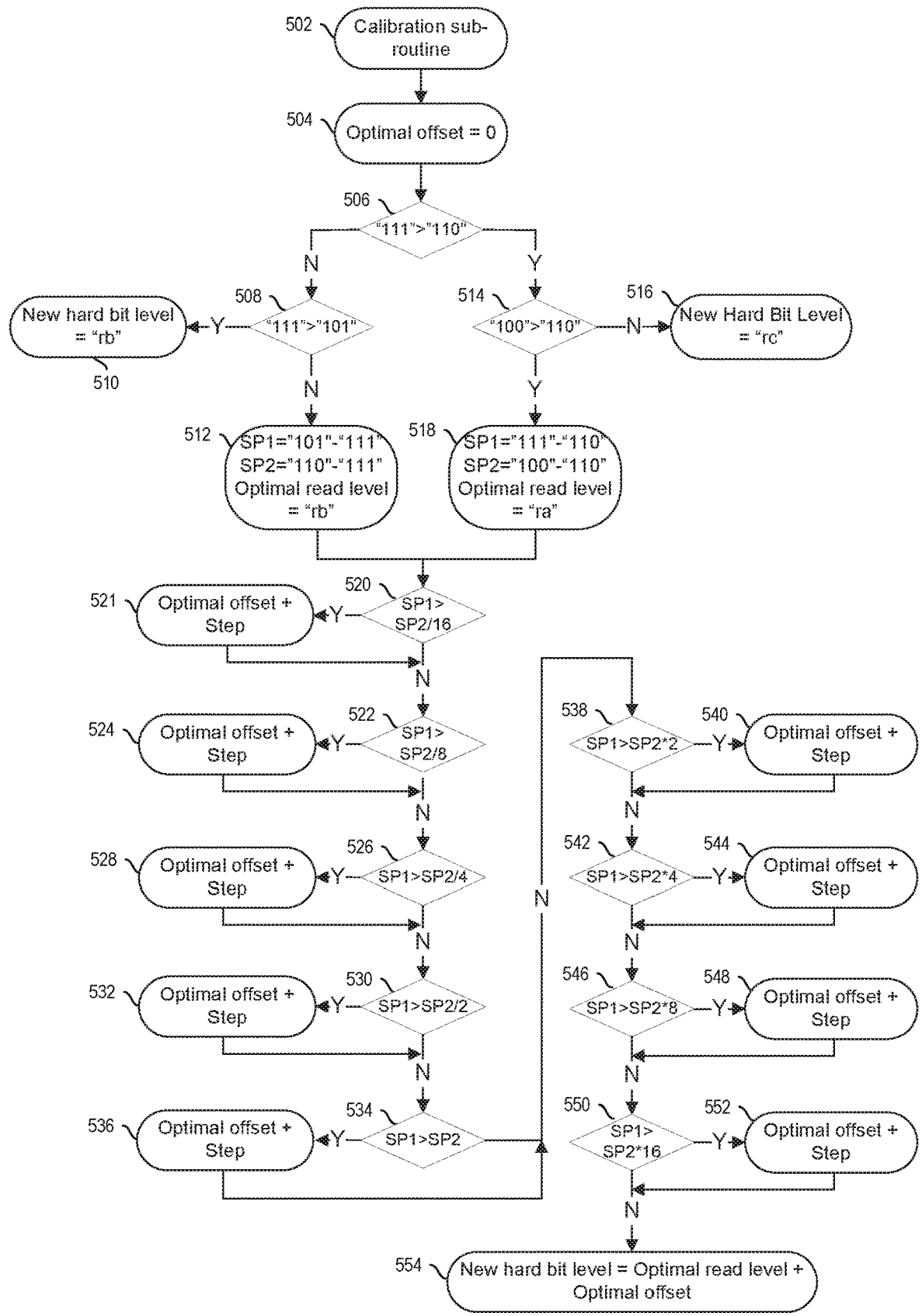
FIG. 5 illustrates a flow for determining a calibrated read level during segmented automatic read calibration in accordance with certain embodiments.

FIG. 5 illustrates a flow for determining a read level during segmented automatic read calibration in accordance with certain embodiments. This flow may be used to determine the optimal wordline read voltage offset based on the histograms generated during the segmented automatic read calibration.

At 502, a calibration sub-routine is performed. The sub-routine may include any suitable operations, such as the operations described above with respect to FIG. 4 for generating the histograms 101, 111, 110, and 100 or any other operations (e.g., operations described in FIG. 6 for obtaining the information used by the flow of FIG. 5).

At 504, a variable for the optimal offset is initialized to zero. In alternative embodiments, the variable may be initialized to any suitable non-zero value (e.g., a value specified by a host via a set trim command).

At 506, a determination is made as to whether the count of histogram 111 is greater than the count of histogram 110. If the decision is no, then the flow moves to 508, and if the decision is yes, then the flow moves to 514. At 508, a determination is made as to whether the count of histogram 111 is greater than the count of histogram 101. If the decision is yes, then a variable "new hard bit level" is set to the wordline wordline read voltage level rb at 510. At 514, a determination is made as to whether the count of histogram 100 is greater than the count of histogram 110. If the decision is no, then the variable "new hard bit level" is set to the wordline wordline read voltage level rc at 516. If the decision at 508 is no, then a variable "SP1" is set equal to the count of histogram 101 minus the count of histogram 111, a variable "SP2" is set equal to the count of histogram 110 minus the count of histogram 111, and a variable "optimal read level" is set equal to rb. If the decision at 514 is yes, then SP1 is set equal to the count of histogram 111 minus the count of histogram 110, variable SP2 is set equal to the count of histogram 100 minus the count of histogram 110, and variable optimal read level is set equal to ra.

The flow then moves to 520. Starting at 520, the flow includes a series of comparisons (522, 526, 530, 534, 538, 542, 546, 550) between SP1 and various multiples of SP2 (e.g., where the multiples of SP2 are all powers of two or reciprocals of powers of two). At each comparison, if SP1 is greater than the factor or multiple of SP2, then the variable optimal offset is set equal to the previous value of the optimal offset plus a step value (at 524, 528, 532, 536, 540, 544, 548, 552). Thus, the larger SP1 is in comparison to SP2, the larger the optimal offset will be. At 554, the new hard bit level is set equal to the optimal read level set at 512 or 518 plus the optimal offset.

In some embodiments (such as the one depicted), the final new hard bit level is a level between rb and rc (inclusive). This new hard bit level may be used as a wordline read voltage level for future read operations for the level performed on the wordline (or other similar wordlines).

In various embodiments, this new hard bit level or other information generated during the segmented automatic read calibration (e.g., the histogram counts) may be stored in SRAM or dedicated feature latches of the storage device controller 118, memory device controller 126 or a memory chip controller within a memory chip 123.

Thus, in the embodiment depicted, the optimal read level offset for a specified level is determined by performing five equally spaced senses around the level of interest, analyzing the existing distribution placement, generating four histograms, and calculating and storing the optimal read offset to be used in subsequent regular read operations for the specified level.

Figure 6:
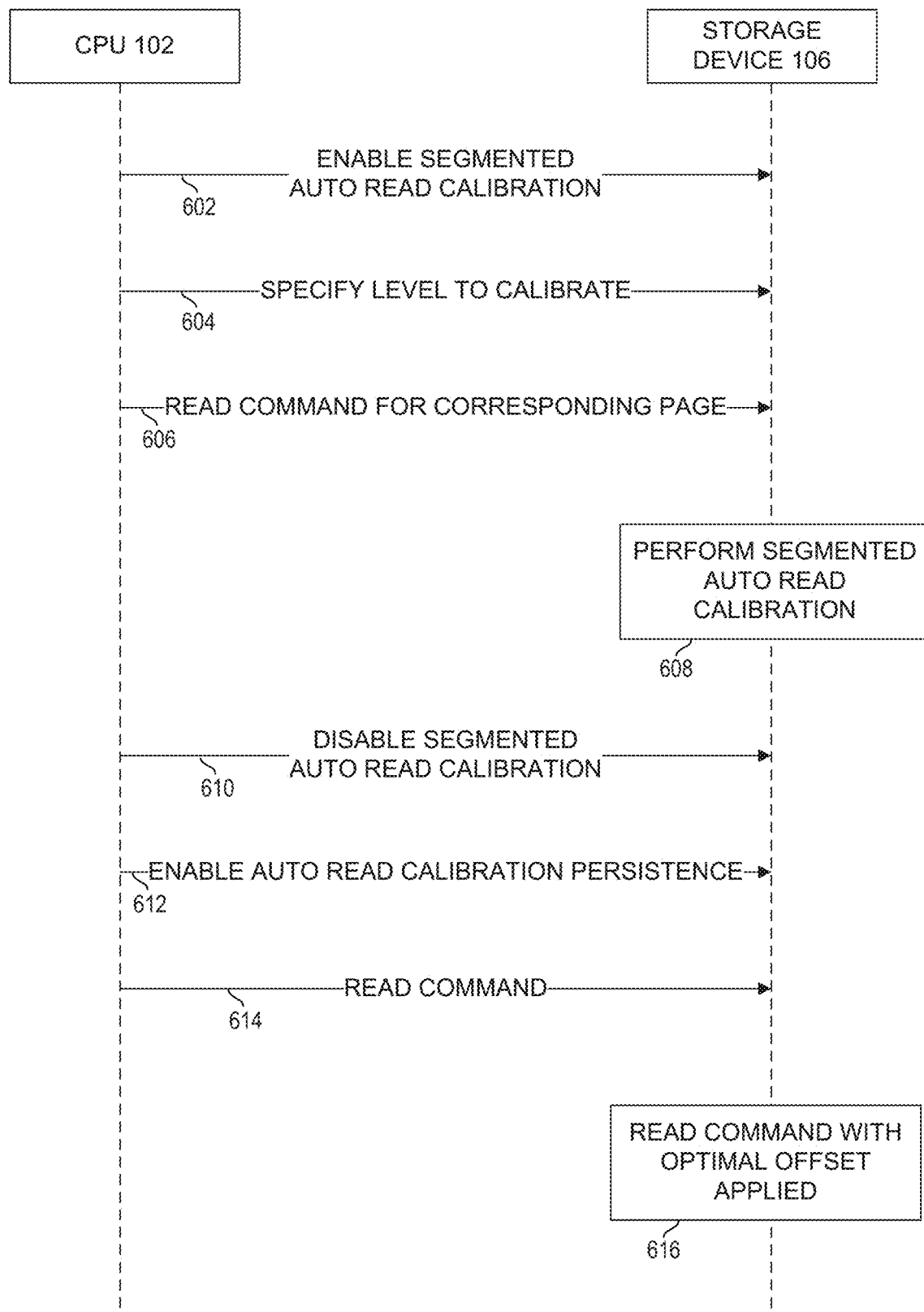
FIG. 6 illustrates a flow for segmented automatic read calibration in accordance with certain embodiments.

FIG. 6 illustrates a flow for segmented automatic read calibration in accordance with certain embodiments. At 602, a host computing device (e.g., CPU 102) sends a command to enable segmented automatic read calibration to the storage device 106. At 604, the host sends a specification of a read level (such as any of those shown in FIG. 3 or other suitable read level) to calibrate to the storage device 106. The communications sent at 602 and 604 may take any suitable form. These communications may be a stand-alone commands or may be integrated with one or more other commands sent from the host to the storage device 106. In one embodiment, the communications may include a set trim command that sets the value of one or more trim latches of the storage device 106 that hold configuration values.

At 606, a read command for the page (e.g., for an XP, TP, UP, or LP if the memory is QLC) corresponding to the level specified at 604 is issued from the host to the storage device 106. The read command may be a single plane or multiplane read command. When segmented automatic read calibration has been enabled, a read operation performed by the storage device 106 may include calibration of the wordline read voltage level as part of the read operation performed. Thus, at 608, the storage device 106 performs segmented automatic read calibration to determine an optimal read voltage level. For example, the storage device 106 may perform any of the operations described above with respect to FIGS. 4 and 5 to determine the optimal read voltage level.

If the calibration of multiple read levels is desired, operations 604, 606, and 608 may be repeated for each read level that is calibrated. Thus, the host may control which level(s)

are calibrated. For example, the host may direct that all of the read levels are calibrated by iterating through the levels or may direct that only a selected one or more of the read levels are calibrated (e.g., only read levels for which suboptimal performance has been noticed may be calibrated). In some embodiments, the levels to calibrate may be aggregated into a single communication from the host to the storage device 106 or the pages to read may be aggregated into a single command. In another embodiment, a single command sent from the host to the storage device 106 may instruct the storage device 106 to iterate through calibration of all of the read levels (without the host needing to specify the levels or pages). In yet another embodiment, segmented auto read calibration for one or more levels may be performed by the storage device 106 as part of some other command or operation performed by the storage device 106 without an explicit command from the host to perform segmented automatic read calibration.

The calibrated read levels may be stored in any suitable memory of the storage device 106. For example, the calibrated read levels may be stored in latches (e.g., trim latches or feature latches) of a storage device controller 118, controller 126, or memory chip 123. After each automatic read calibration segment the output data (i.e., the read data) may be invalid and the host may ignore this data and the calibrated offsets for the levels (e.g., L1 to L15 if QLC is used and all levels are calibrated) may be available in SRAM of the memory chip 123 in which the calibration was performed as well as in corresponding persist feature latches of the memory chip 123. These stored calibrated read levels may then be used for reads on the same cells or for reads of cells that are expected to behave similarly with the cells that were calibrated (e.g., different wordlines within the same block, wordlines within the same memory chip 123, etc.)

After the selected levels have been calibrated, the host sends the storage device 106 a request to disable segmented automatic read calibration 610 and a request to enable automatic read calibration persistence at 612. When automatic read calibration persistence is enabled, read commands performed by the storage device 106 will utilize the optimum read voltage levels determined using the segmented automatic read calibration. Thus, at 614, the host may send a read command requesting a particular page of data (e.g., an LP, UP, TP, or XP in the case of QLC memory). The read command may then be performed at 616 by the storage device 106 utilizing the optimal offset read level.

Segmented automatic read calibration operations may be incorporated with moving read reference, read retry, and address cycle read offsets operations (e.g., the calibrated read voltage may be used as a baseline read voltage for any of these operations). In some embodiments, the segmented automatic read calibration operations are performed before any of these other operations during performance of a read command. Segmented automatic read calibration operations may also be used in conjunction with Single Bit Soft Bit Read, Soft Bit Read, and Corrective Read, although these operations may not occur simultaneously.

Segmented automatic read calibration may be compatible with program suspend operations. For example, if a program/write operation is being performed by a memory chip 123 and a read operation is requested (while segmented automatic read calibration is turned on), the program/write operation may be paused, the read operation is performed, and then the program/write operation is resumed (without loss of the data to be programmed as the segmented automatic read calibration operation does not disturb the latches used to store the data to be programmed). In some implementations of conventional automatic read calibration, each of the senses (at the respective wordline read voltage levels) is stored in latches or registers (thus utilizing a lot of space on the memory chip 123 including latches used during the program operation) and then XOR operations are performed on pairs of sensed data to determine which bits have flipped. In various embodiments utilizing segmented automatic read calibration or fast automatic read calibration, a sense is performed and the sensed data is stored in latches or registers, the next sense is performed and the sensed data is stored in another set of latches or registers, an XOR is performed and a determination of how many bits have flipped is made and stored on-chip, and then the next sense is performed and the sensed data may be stored by overwriting the previously sensed data (which is no longer needed). This sequence may be continued as each successive sense overwrites data from a previous sense.

If a read page multi plane (e.g., dual plane, quad plane) command is issued while segmented automatic read calibration is enabled, the optimal read offset will be generated from the block associated with the least significant plane whose block is not tagged as bad. In various embodiments, segmented automatic read calibration is not available for use with unbalanced planes.

In various embodiments, the stored read offsets will persist through a soft reset command for chip 123. If the soft reset command is received during performance of a read with segmented automatic read calibration enabled, the calibration values are not guaranteed to be valid. In some embodiments, a hard reset command will change all the values of the stored read offsets to their default values.

FIG. 7 illustrates a table 700 for configuration parameters associated with segmented automatic read calibration in accordance with certain embodiments. Table 700 depicts a seg_arc_en parameter that enables or disables segmented automatic read calibration depending on the value of the parameter. Table 700 also depicts a seg_arc_lv parameter that specifies the level that is to be calibrated when a read command is received. In the embodiment depicted, a fully programmed QLC memory is contemplated. Thus, each unique value of the seg_arc_lv parameter specifies a read level (e.g., L1 through L15). The depicted table also lists the corresponding page to be read when calibration of the specified level is performed (e.g., the calibration is performed the next time the host issues a read command for the page of data that corresponds to the seg_arc_lv value).

Through set trim operations (or other requests that specify whether segmented automatic read calibration is to be enabled or disabled and what level is to be calibrated), the host can enable the segmented automatic read calibration feature, specify the level of interest, and in some embodiments may define the separation of the strobes (e.g., the amount of difference in voltage of the various read voltages used during calibration). In some embodiments, the storage device 106 may also support a conventional automatic read calibration operation, but this calibration should be disabled if segmented automatic read calibration is to be performed.

FIG. 8 illustrates a placement density graph 800 and sensing voltages P3, P2, and P1 that may be used in a fast automatic read calibration operation in accordance with certain embodiments. This placement density graph may have characteristics similar to the graphs of FIG. 3 and FIG. 4. FIG. 8 also depicts histograms H2 and H1 which may include counts of bits that flipped between pairs of sensed data. For example, H2 may include the number of bits that flipped between data sensed at P3 and data sensed at P2 and H1 may include the number of bits that flipped between data sensed at P2 and data sensed at P1.

Fast automatic read calibration may improve quality of service on a system by allowing calibration earlier in the read recovery flow than conventional automatic read calibration (e.g., when the bit error rate is higher than the error correcting code limit) and performing calibration in a faster manner.

In various embodiments, the fast automatic read calibration comprises applying three equally spaced senses around each level by changing a voltage at a node of the sense circuit (e.g., a boost node) while keeping the word line voltage constant, analyzing the existing distribution placement, generating two histograms, and calculating and storing a calibrated read offset to be used in subsequent regular read operations. This sequence may be repeated for each level associated with a particular page. For example, referring back to the storage scheme contemplated by FIG. 7, if a TP is being read, the fast automatic read calibration sequence may be performed for levels 1, 3, 5, 7, 9, 11, 13, and 15, whereas if a XP is being read, the sequence may be performed for levels 2, 6, 10, and 14. In other embodiments, more or fewer senses around each level may be performed or the sense voltages are not equally spaced.

FIG. 9 illustrates a sense circuit 900 that may be used for fast automatic read calibration in accordance with certain embodiments. Sense circuit 900 is coupled to a bitline 902 that is coupled to a cell to be sensed during a read operation. During the read operation, a wordline read voltage is applied to the wordline coupled to the cells to be sensed. Other operations may be performed eventually resulting in the threshold voltage of the cell being sensed being transposed to the boost node 904 that is the input to a sense amplifier 906. The iso switch 908 is then closed to hold the voltage at the sense node 904 at a constant level. The sense amplifier 906 resolves the value of the cell being sensed by comparing the voltage at the sense node 904 against a reference voltage Vref 910.

During fast automatic read calibration, a parameter of the sense circuit 900 may be modulated to determine a calibrated parameter. In a first embodiment, the parameter that is modulated is the boost voltage 912 (e.g., the boost voltage may be ramped from low to high). For example, a first boost voltage may be applied (e.g., to each sense circuit 900 of a page being read) and the page is sensed. Similarly, the page may be sensed at other boost voltages (e.g., two additional boost voltages). In another embodiment, a different parameter, such as the reference voltage Vref 910 may be modulated and the pages sensed at each modulated value. When the boost voltage 912 or the Vref 910 is modulated, a large portion of the sense operation only needs to be performed once, thus saving a large amount of time relative to a calibration scheme that relies on sensing the data at different wordline voltages. For example, the whole sequence of the sense operation up to the point where the iso switch 908 is closed (thus transposing the value of the cell being sensed onto the sense node 904) is only performed once, and then the sense node 904 may be compared against the reference voltage 910 for each value of the modulated parameter (e.g., boost voltage 912 or reference voltage 910). In other embodiments, other parameters that may affect the voltage at the sense node 904 may be modulated. For example, an amount of time (e.g., a delay until iso switch 908 is closed) may be modulated and the page sensed for different amounts of time. In various embodiments, the wordline voltage coupled to the cells being sensed is held constant while the parameter is modulated and the sense nodes 904 measured.

The pages sensed at the modulated parameters may be used to generate the histograms (e.g., H1 and H2). For example, the page sensed at a first modulated parameter value may be compared with a page sensed at a second modulated parameter value and the number of bits that are different are counted and stored in a histogram. A similar comparison may be made between each pair of sensed pages to generate respective histograms (only one additional comparison is required if three modulated parameter values are used).

Figure 10:
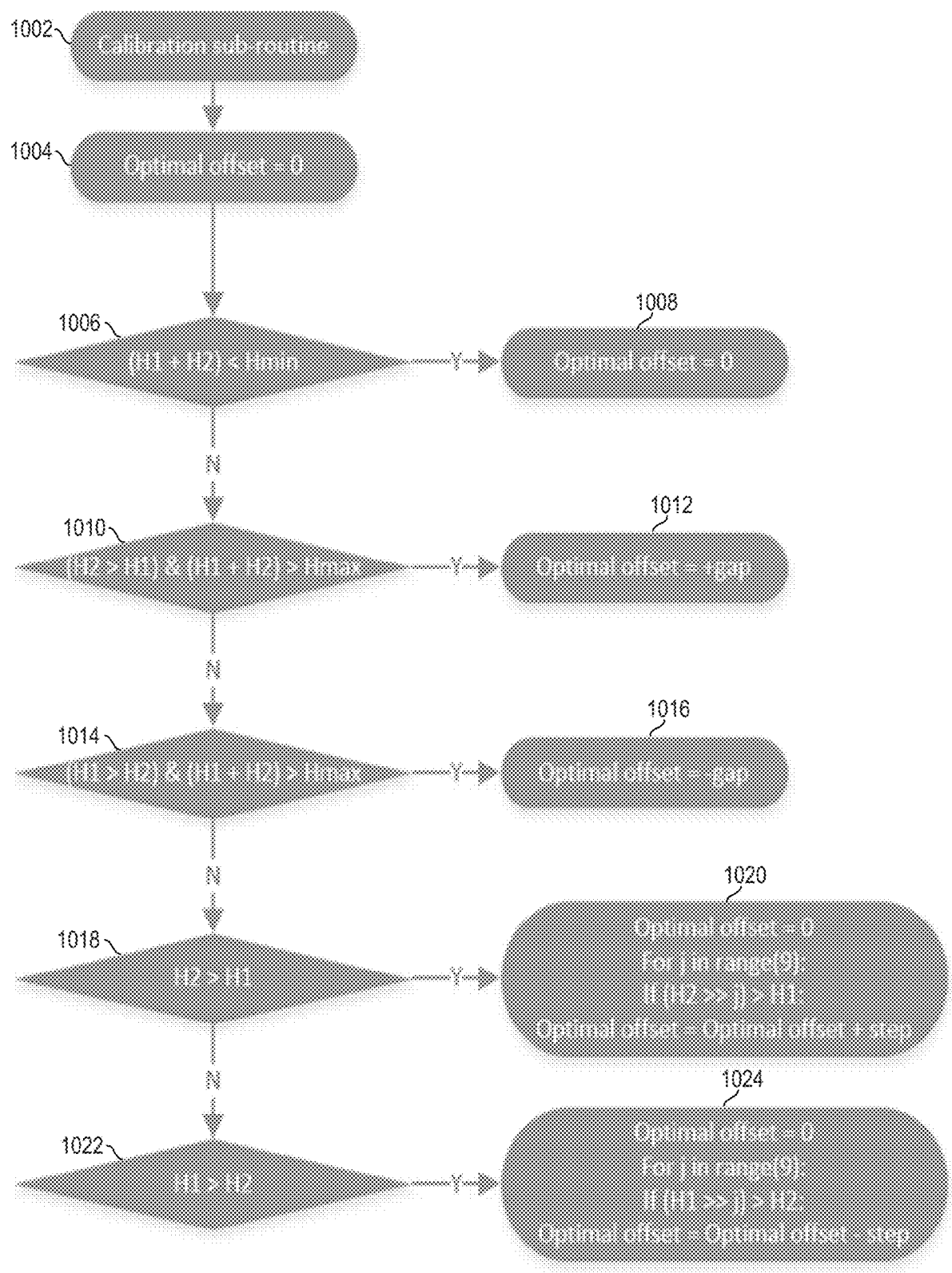
FIG. 10 illustrates a flow for determining a calibrated parameter during fast automatic read calibration in accordance with certain embodiments.

FIG. 10 illustrates a flow for determining a read level during fast automatic read calibration in accordance with certain embodiments. This flow may be used to determine a calibrated parameter value (e.g., a boost voltage 912 or Vref 910) based on the histograms generated during the segmented automatic read calibration.

At 1002, a calibration sub-routine is performed. The sub-routine may include any suitable operations, such as the operations described above with respect to FIG. 8 for generating the histograms H1 and H2 or any other operations (e.g., operations described in FIG. 11 for obtaining the information used by the flow of FIG. 10).

At 1004, a variable for the optimal offset is initialized to zero. In alternative embodiments, the variable may be initialized to any suitable non-zero value (e.g., a value specified by a host via a set trim command or other request).

At 1006, a determination is made as to whether the sum of the counts of histograms H1 and H2 is less than a minimum count value (Hmin). If the sum is smaller, the optimal offset is set to 0 at 1008 and the flow ends. If the sum is not smaller, the flow moves to 1010 where a determination is made as to whether H2>1 and the sum of H1 and H2 is greater than a maximum count value (Hmax). If the determination is yes, the optimal offset is set equal to a gap value at 1012 and the flow ends. If the determination is no, the flow moves to 1014 where a determination is made as to whether H1>H2 and the sum of H1 and H2 is greater than Hmax. If the determination is yes, the flow moves to 1016 where the optimal offset is set equal to a negative gap value. If the determination is no, the flow moves to 1018 where a determination is made as to whether H2>H1. If the determination is yes, the flow moves to 1020. At 1020, the optimal offset is initialized to 0 and then an iteration is performed. At each iteration, a bit shift is performed on H2 (effectively dividing H2 by a power of 2 with the exponent being increased by one each iteration). At each iteration if the shifted value of H2 is still greater than H1, the optimal offset is increased by a step value. Once the iterations are complete (or after the iteration where the shifted value is not greater than H1) the flow ends. If the determination at 1018 is no, the flow moves to 1022. At 1022, if a determination is made that H1>H2, the flow moves to 1024, where a similar iteration to that performed at 1020 is performed. In 1024, the roles of H2 and H1 are reversed, and for each iteration in which the shifted value of H1 is greater than H2, the optimal offset is reduced by the step value.

The optimal offset determined may then be used to set the parameter (e.g., the boost voltage 912 or the reference voltage 910) in future read operations for the particular level associated with the calibration. The flow of FIG. 10 (or other flow for determining an optimal offset based on sense operations performed at multiple values of the modulated parameter) may be repeated for each level that is sensed during the read of a particular page.

In various embodiments, this optimal offset may be stored in SRAM, dedicated feature latches, or other memory of the storage device controller 118, memory device controller 126 or a memory chip controller within a memory chip 123.

Figure 11:
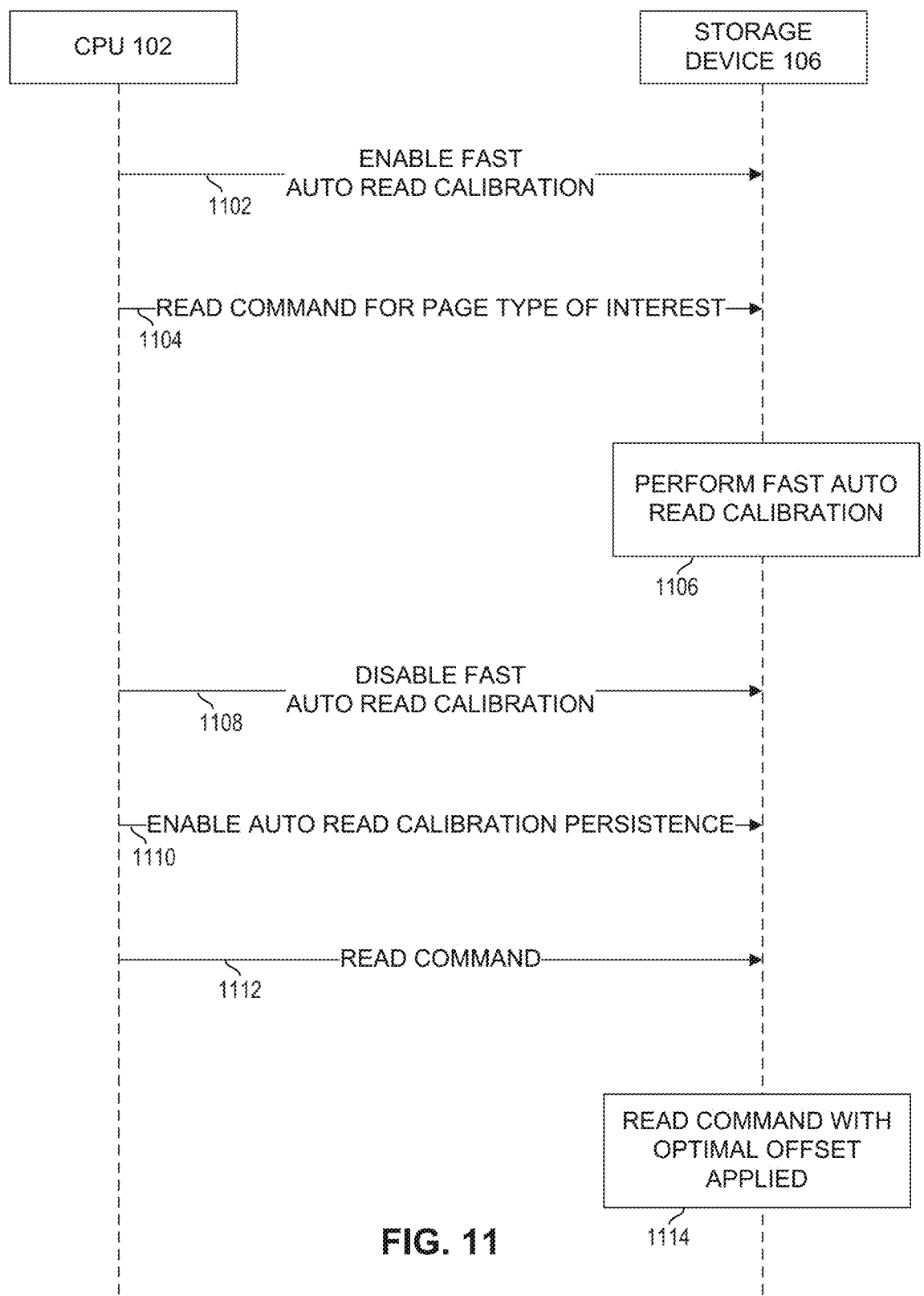
FIG. 11 illustrates a flow for fast automatic read calibration in accordance with certain embodiments.

FIG. 11 illustrates a flow for fast automatic read calibration in accordance with certain embodiments. The flow may have any suitable characteristics of the flow of FIG. 6 (e.g., the types of requests made from the host to the storage device 106 may be similar).

At 1102, the host sends a request to the storage device 106 to enable fast automatic read calibration. The storage device 106 then enables fast automatic read calibration. At 1104, the host sends a read command for the page type of interest to the storage device 106. At 1106, the storage device 106 performs fast automatic read calibration. For example, for each level sensed as part of the read command, the storage device 106 may perform the flow of FIG. 10 (or other suitable flow) to determine an optimal offset value for the level. The optimal offsets may be stored so that they may be reused for normal reads to the cells that were calibrated and other cells that are expected to perform similarly. At 1108, the host sends a request to disable fast automatic read calibration to the storage device 106. At 1110, the host sends a request to enable automatic read calibration persistence. This request may instruct the storage device 106 to utilize the optimal offsets determined during calibration in future read operations. At 1112 a read command is sent from the host to the storage device. The optimal offsets determined during 1106 are then used to perform the read command at 1114.

After each fast automatic read calibration operation the output data (i.e., the read data) may be invalid and the host may ignore this data and the calibrated offsets for the levels (e.g., L1 to L15 if QLC is used and all levels are calibrated) may be available in SRAM of the memory chip 123 in which the calibration was performed as well as in corresponding persist feature latches of the memory chip 123.

Fast automatic read calibration operations may be incorporated with moving read reference, read retry, and address cycle read offsets operations (e.g., when a level is read the optimal offset may be applied any of these operations may also be performed). In some embodiments, the fast automatic read calibration operations are performed before any of these other operations during performance of a read command. Fast automatic read calibration operations may also be used in conjunction with Single Bit Soft Bit Read, Soft Bit Read, and Corrective Read, although these operations may not occur simultaneously.

If a read page multi plane (e.g., dual plane, quad plane) command is issued while fast automatic read calibration is enabled, the optimal offset will be generated from the block associated with the least significant plane whose block is not tagged as bad. In various embodiments, fast automatic read calibration is not available for use with unbalanced planes.

In various embodiments, the stored optimal offsets will persist through a soft reset command for chip 123. If the soft reset command is received during performance of a read with fast automatic read calibration enabled, the calibration values are not guaranteed to be valid. In some embodiments, a hard reset command will change all the values of the stored read offsets to their default values.

FIG. 12 illustrates a table 1200 for configuration parameters associated with fast automatic read calibration in accordance with certain embodiments. The parameters include a farc_en parameter that enables or disables fast automatic read calibration depending on the value of the parameter. The parameters depicted assume that the parameter that is modulated is the boost voltage 912 (which is coupled to the sense node via a capacitor). The parameters include high and medium boost voltages (which may be two of the modulated boost voltages that are applied during calibration), temperature coefficients to compensate for temperature differentials when the high boost and medium boost voltages are applied (may be used to adjust the boost voltage based on the local temperature), as well as a boost ramp time (e.g., a delay between applying a different boost voltage after a previous boost voltage is applied). The parameters also include a minimum histogram threshold (e.g., Hmin of FIG. 10) and maximum histogram threshold (e.g., Hmax of FIG. 10). The parameters further include a separation of the strobes in terms of the wordline voltage (e.g., gap of FIG. 10), and a fine offset for calibration (e.g., step of FIG. 10), and a wordline offset for centering the middle strobe. In other embodiments, any subset of these parameters or other parameters associated with fast automatic read calibration may be configurable by the host.

Thus, through set trim operations (or other requests that specify the parameter values), the host can enable the fast automatic read calibration feature, define the separation of the strobes and their coefficients for temperature compensation, and specify other algorithm options such as minimum and maximum histogram thresholds as well as word line offset for centering the strobes with respect to the original read level. To start the Fast Automatic read calibration operation, the host can issue a read page or read page multi plane command for the page type of interest.

The flows described in FIGS. 5, 6, 10, and 11 are merely representative of operations that may occur in particular embodiments. Operations may be performed in any suitable order without departing from the scope of particular embodiments. In other embodiments, additional operations may be performed in the flow. Some of the operations illustrated in these FIGs. may be repeated, combined, modified, or deleted where appropriate.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disk may be the machine readable medium to store information transmitted via optical or electrical wave modulated or otherwise generated to transmit such information. When an electrical carrier wave indicating or carrying the code or design is transmitted, to the extent that copying, buffering, or retransmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

A module as used herein or as depicted in the FIGs. refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the flows described or functionality of the various components such as CPU 102, external I/O controller 104, I/O devices 105, storage device 106, system memory device 107, subcomponents of any of these, or other entity, system, or component described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A machine-accessible/readable medium includes any mechanism that provides (i.e., stores and/or transmits) information in a form readable by a machine, such as a computer or electronic system. For example, a machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

Example 1 may include an apparatus comprises a plurality of memory cells; a plurality of sense circuits, a sense circuit comprising a sense node selectively coupled to a bitline coupled to a first cell of the plurality of memory cells; and a controller to transpose a value indicative of a voltage of the first cell to the sense node; isolate the sense node from the bitline; and calibrate a parameter for the sense circuit based on outputs of the sense circuit for each of a plurality of different applied values of the parameter.

Example 2 includes the subject matter of Example 1, wherein the parameter comprises a boost node voltage coupled through a capacitor to the sense node.

Example 3 includes the subject matter of Example 1, wherein the parameter comprises a reference voltage coupled to a sense amplifier of the sense circuit.

Example 4 includes the subject matter of any one of Examples 1-3, wherein calibrating the parameter comprises determining an interpolated value in between two of the applied values of the parameter.

Example 5 includes the subject matter of Example 4, wherein calibrating the parameter comprises determining the interpolated value based on a histogram comprising a count of number of bits that flipped between a first page read when a first value is applied for the parameter and a second page read when a second value is applied for the parameter.

Example 6 includes the subject matter of Example 5, wherein calibrating the parameter comprises shifting the count and comparing the shifted count to a second count of a second histogram.

Example 7 includes the subject matter of Example 6, wherein calibrating the parameter comprises adjusting a variable representing the parameter by a step voltage based on the comparison.

Example 8 includes the subject matter of any one of Examples 1-7, further comprising a memory to store a calibration enable parameter, wherein the controller is configured to calibrate the parameter when a read is performed if the calibration enable parameter is set and to perform a regular read operation if the calibration enable parameter is not set.

Example 9 includes the subject matter of Example 8, wherein the controller is to receive a request to set the calibration enable parameter from a host computing device.

Example 10 includes the subject matter of any one of Examples 1-9, wherein the controller is to receive at least one of the applied values of the parameter from a host computing device.

Example 11 includes a method comprising transposing a value indicative of a voltage of a first memory cell to a sense node of a sense circuit; isolating the sense node from a bitline selectively coupled to the first memory cell; and calibrating a parameter for the sense circuit based on outputs of the sense circuit for each of a plurality of different applied values of the parameter.

Example 12 includes the subject matter of Example 11, wherein the parameter comprises a boost node voltage coupled through a capacitor to the sense node.

Example 13 includes the subject matter of Example 11, wherein the parameter comprises a reference voltage coupled to a sense amplifier of the sense circuit.

Example 14 includes the subject matter of any one of Examples 11-13, wherein calibrating the parameter comprises determining an interpolated value in between two of the applied values of the parameter.

Example 15 includes the subject matter of any one of Example 14, wherein calibrating the parameter comprises determining the interpolated value based on a histogram comprising a count of number of bits that flipped between a first page read when a first value is applied for the parameter and a second page read when a second value is applied for the parameter.

Example 16 includes the subject matter of Example 15, wherein calibrating the parameter comprises shifting the count and comparing the shifted count to a second count of a second histogram.

Example 17 includes the subject matter of Example 16, wherein calibrating the parameter comprises adjusting a variable representing the parameter by a step voltage based on the comparison.

Example 18 includes the subject matter of any one of Examples 11-17, further comprising storing a calibration enable parameter in memory and calibrating the parameter when a read is performed if the calibration enable parameter is set and performing a regular read operation if the calibration enable parameter is not set.

Example 19 includes the subject matter of Example 18, further comprising receiving a request to set the calibration enable parameter from a host computing device.

Example 20 includes the subject matter of any one of Examples 11-19, further comprising receiving at least one of the applied values of the parameter from a host computing device.

Example 21 includes a storage device comprising a storage device controller; and a plurality of memory chips, wherein a memory chip comprises a plurality of memory cells; a plurality of sense circuits, a sense circuit comprising a sense node selectively coupled to a bitline coupled to a first cell of the plurality of memory cells; and a memory chip controller to transpose a value indicative of a voltage of the first cell to the sense node; isolate the sense node from the bitline; and calibrate a parameter for the sense circuit based on outputs of the sense circuit for each of a plurality of different applied values of the parameter.

Example 22 includes the subject matter of Example 21, wherein the parameter comprises a boost node voltage coupled through a capacitor to the sense node.

Example 23 includes the subject matter of Example 21, wherein the parameter comprises a reference voltage coupled to a sense amplifier of the sense circuit.

Example 24 includes the subject matter of any one of Examples 21-23, wherein calibrating the parameter comprises determining an interpolated value in between two of the applied values of the parameter.

Example 25 includes the subject matter of Example 24, wherein calibrating the parameter comprises determining the interpolated value based on a histogram comprising a count of number of bits that flipped between a first page read when a first value is applied for the parameter and a second page read when a second value is applied for the parameter.

Example 26 includes the subject matter of Example 25, wherein calibrating the parameter comprises shifting the count and comparing the shifted count to a second count of a second histogram.

Example 27 includes the subject matter of Example 26, wherein calibrating the parameter comprises adjusting a variable representing the parameter by a step voltage based on the comparison.

Example 28 includes the subject matter of any one of Examples 21-27, further comprising a memory to store a calibration enable parameter, wherein the memory chip controller is configured to calibrate the parameter when a read is performed if the calibration enable parameter is set and to perform a regular read operation if the calibration enable parameter is not set.

Example 29 includes the subject matter of Example 28, wherein the memory chip controller is to receive a request to set the calibration enable parameter from a host computing device.

Example 30 includes the subject matter of any one of Examples 21-29, wherein the memory chip controller is to receive at least one of the applied values of the parameter from a host computing device.

What is claimed is:

1. An apparatus comprising:
   a plurality of memory cells;
   a plurality of sense circuits, a sense circuit comprising a sense node selectively coupled to a bitline coupled to a first cell of the plurality of memory cells; and
   a controller to:
      transpose a value indicative of a voltage of the first cell to the sense node;
      isolate the sense node from the bitline;
      calibrate a parameter for the sense circuit based on outputs of the sense circuit for each of a plurality of different applied values of the parameter; and
      store the calibrated parameter and apply the calibrated parameter in a subsequent read operation.

2. The apparatus of claim 1, wherein the parameter comprises a boost node voltage coupled through a capacitor to the sense node.

3. The apparatus of claim 1, wherein the parameter comprises a reference voltage coupled to a sense amplifier of the sense circuit.

4. The apparatus of claim 1, wherein calibrating the parameter comprises determining an interpolated value in between two of the applied values of the parameter.

5. The apparatus of claim 4, wherein calibrating the parameter comprises determining the interpolated value based on a histogram comprising a count of number of bits that flipped between a first page read when a first value is applied for the parameter and a second page read when a second value is applied for the parameter.

6. The apparatus of claim 5, wherein calibrating the parameter comprises shifting the count and comparing the shifted count to a second count of a second histogram.

7. The apparatus of claim 6, wherein calibrating the parameter comprises adjusting a variable representing the parameter by a step voltage based on the comparison.

8. The apparatus of claim 1, further comprising a memory to store a calibration enable parameter, wherein the controller is configured to calibrate the parameter when a read is performed if the calibration enable parameter is set and to perform a regular read operation if the calibration enable parameter is not set.

9. The apparatus of claim 8, wherein the controller is to receive a request to set the calibration enable parameter from a host computing device.

10. The apparatus of claim 1, wherein the controller is to receive at least one of the applied values of the parameter from a host computing device.

11. A method comprising:
   transposing a value indicative of a voltage of a first memory cell to a sense node of a sense circuit;
   isolating the sense node from a bitline selectively coupled to the first memory cell;
   calibrating a parameter for the sense circuit based on outputs of the sense circuit for each of a plurality of different applied values of the parameter; and
   storing, by a controller, the calibrated parameter and applying, by the controller, the calibrated parameter in a subsequent read operation.

12. The method of claim 11, wherein the parameter comprises a boost node voltage coupled through a capacitor to the sense node.

13. The method of claim 11, wherein the parameter comprises a reference voltage coupled to a sense amplifier of the sense circuit.

14. The method of claim 11, wherein calibrating the parameter comprises determining an interpolated value in between two of the applied values of the parameter.

15. The method of claim 14, wherein calibrating the parameter comprises determining the interpolated value based on a histogram comprising a count of number of bits that flipped between a first page read when a first value is applied for the parameter and a second page read when a second value is applied for the parameter.

16. A storage device comprising:
 a storage device controller; and
 a plurality of memory chips, wherein a memory chip comprises:
  a plurality of memory cells;
  a plurality of sense circuits, a sense circuit comprising a sense node selectively coupled to a bitline coupled to a first cell of the plurality of memory cells; and
  a memory chip controller to:
   transpose a value indicative of a voltage of the first cell to the sense node;
   isolate the sense node from the bitline;
   calibrate a parameter for the sense circuit based on outputs of the sense circuit for each of a plurality of different applied values of the parameter; and
   store the calibrated parameter and apply the calibrated parameter in a subsequent read operation.

17. The storage device of claim 16, wherein the parameter comprises a boost node voltage coupled through a capacitor to the sense node.

18. The storage device of claim 16, wherein the parameter comprises a reference voltage coupled to a sense amplifier of the sense circuit.

19. The storage device of claim 16, wherein calibrating the parameter comprises determining an interpolated value in between two of the applied values of the parameter.

20. The storage device of claim 19, wherein calibrating the parameter comprises determining the interpolated value based on a histogram comprising a count of number of bits that flipped between a first page read when a first value is applied for the parameter and a second page read when a second value is applied for the parameter.

\* \* \* \* \*